US011211404B2

(12) United States Patent
Salahuddin et al.

(10) Patent No.: US 11,211,404 B2
(45) Date of Patent: Dec. 28, 2021

(54) MEMORY DEVICES BASED ON FERROELECTRIC FIELD EFFECT TRANSISTORS

(71) Applicant: IMEC vzw, Leuven (BE)

(72) Inventors: Shairfe Muhammad Salahuddin, Leuven (BE); Jan Van Houdt, Bekkevoort (BE); Julien Ryckaert, Schaerbeek (BE); Alessio Spessot, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/565,112

(22) Filed: Sep. 9, 2019

(65) Prior Publication Data

US 2020/0083234 A1 Mar. 12, 2020

(30) Foreign Application Priority Data

Sep. 10, 2018 (EP) .................................... 18193488

(51) Int. Cl.
| | | |
|---|---|---|
| *G11C 11/22* | (2006.01) | |
| *H01L 27/1159* | (2017.01) | |
| *G11C 11/4096* | (2006.01) | |
| *H01L 27/108* | (2006.01) | |
| *H01L 27/11587* | (2017.01) | |
| *H01L 27/11592* | (2017.01) | |

(52) U.S. Cl.
CPC ........ *H01L 27/1159* (2013.01); *G11C 11/223* (2013.01); *G11C 11/2273* (2013.01); *G11C 11/2275* (2013.01); *G11C 11/4096* (2013.01); *H01L 27/10844* (2013.01); *H01L 27/10897* (2013.01); *H01L 27/11587* (2013.01); *H01L 27/11592* (2013.01)

(58) Field of Classification Search
CPC ...................................................... G11C 11/22
USPC ......................................................... 365/148
See application file for complete search history.

(56) References Cited

U.S. PATENT DOCUMENTS

| 5,446,688 | A | * | 8/1995 | Torimaru ............... G11C 11/22 |
| | | | | 257/E27.104 |
| 5,737,261 | A | * | 4/1998 | Taira .................... G11C 11/5657 |
| | | | | 365/145 |
| 8,379,433 | B2 | | 2/2013 | Houston et al. |
| 8,576,620 | B2 | * | 11/2013 | Yamazaki ............. G11C 7/067 |
| | | | | 365/182 |

(Continued)

OTHER PUBLICATIONS

European Search Report dated Dec. 3, 2018 in European Application No. 18193488; 11 pages.

*Primary Examiner* — Muna A Techane
(74) *Attorney, Agent, or Firm* — Knobbe, Martens, Olson & Bear, LLP

(57) ABSTRACT

The disclosed technology is generally directed to semiconductor integrated circuit devices and more particularly to a three-transistor random access memory (3T RAM) device, and a method of fabricating and operating the same. In one aspect, a 3T RAM cell includes a ferroelectric-based field effect transistor (FeFET) having a first gate connected as a storage node and a second transistor connected between the FeFET and a read bit line having a second gate connected to a read word line. The 3T RAM cell also includes a third transistor connected between the storage node and a write bit line having a third gate connected to a write word line.

13 Claims, 12 Drawing Sheets

(56) References Cited

U.S. PATENT DOCUMENTS

| | | | | |
|---|---|---|---|---|
| 2014/0103414 A1* | 4/2014 | Koldiaev | ............ | H01L 27/1203 |
| | | | | 257/296 |
| 2016/0071947 A1* | 3/2016 | Wiatr | ................ | H01L 29/66545 |
| | | | | 257/295 |
| 2018/0122478 A1* | 5/2018 | Morris | ................ | G11C 11/2273 |
| 2018/0323200 A1* | 11/2018 | Tang | ................ | H01L 27/10805 |

* cited by examiner

MEMORY DEVICES BASED ON FERROELECTRIC FIELD EFFECT TRANSISTORS

CROSS-REFERENCE TO RELATED APPLICATIONS

This application claims foreign priority to European Application No. EP 18193488.6, filed Sep. 10, 2018, the content of which is incorporated by reference herein in its entirety.

BACKGROUND

Field

The disclosed technology is generally directed to semiconductor integrated circuit devices and more particularly to a three-transistor random access memory device, and a method of fabricating and operating the same.

Description of the Related Technology

A typical computer memory device is designed to store many thousands of bits of information. In some computer memory devices, the bits are stored in individual memory cells that may be organized in a crossbar architecture to make efficient use of the lateral footprint of the semiconductor substrate on which a memory device may be formed, which reduces cost. The crossbar architecture includes an array of memory cells, a plurality of parallel word lines extended along columns (or rows) of the memory cells, and a plurality of parallel bit lines extended along rows (or columns) of the memory cells.

A commonly used cell architecture for a volatile memory is a six transistor static random access memory (6T SRAM) cell. As computer memory has increased in the number of bits needed, effort has been placed on reducing the size of an individual memory cell.

Another commonly used cell architecture for a volatile memory is a three transistor dynamic random access memory (3T DRAM) which has, for example, been disclosed in U.S. Pat. No. 8,379,433.

However, a drawback of an SRAM or a DRAM is that they are volatile memory devices. That is, the memory cells of SRAMs and DRAMs lose their memory states without persistent power supplied thereto. For example, DRAMs require periodic refreshing of the memory state. Thus, there is a need for a non-volatile memory device architecture that makes efficient use of the lateral footprint of the semiconductor substrate.

SUMMARY OF CERTAIN INVENTIVE ASPECTS

It is an aim of the present disclosure is to provide an improved memory cell, which can for example be used in SRAM- or DRAM-like memories.

It may be an aim of the present disclosure to reduce to the size of the cell architecture. It may be another object of the present disclosure to provide a non-volatile memory cell.

A first aspect of the present disclosure provides an integrated circuit including at least one three-transistor random access memory (3T RAM) cell. The 3T RAM cell includes a first transistor having a first gate connected as a storage node and a second transistor connected between the first transistor and a read bit line having a second gate connected to a read word line. The 3T RAM cell also includes a third transistor connected between the storage node and a write bit line having a third gate connected to a write word line. Additionally, the first transistor is a ferroelectric-based field effect transistor (FeFET).

Ferroelectric FETs offer advantageous properties for low power nonvolatile memories by virtue of their three-terminal structure coupled with the ability of the ferroelectric material to retain its polarization in the absence of an electric field. Utilizing the distinct features of FeFETs, a 3T RAM FeFET-based nonvolatile memory cell is disclosed, preferably with separate read and write paths.

In embodiments according to the disclosure, the circuit further comprises a memory controller adapted to apply a write scheme or read scheme to the at least one cell. For example, the write scheme may comprise: applying a write voltage to the write word line and applying the write voltage or ground voltage to the write bit line. The read scheme may comprise: applying a read voltage to the read word line and applying ground voltage to the write word line.

In an embodiment the gate dielectric of the second transistor and the gate dielectric of the third transistor are gate oxides, wherein the gate oxide thickness of the third transistor is larger than the gate oxide thickness of the second transistor such that the third transistor is adapted to sustain a double gate electrical field relative to the second transistor. Advantageously, the third transistor is able to withstand a higher supply voltage.

This embodiment may comprise a memory controller adapted to apply the following write scheme to the at least one cell: applying a write voltage to the write word line and applying the write voltage or the negative write voltage to the write bit line. The memory controller may additionally or alternatively be adapted to apply the following read scheme to the at least one cell: applying a read voltage to the read word line and the write word line and applying a further voltage ranging from ground voltage to the read voltage to the write bit line.

In another embodiment, the source of the first transistor is connected to a further bit line. This embodiment may comprise a memory controller adapted to apply the following write scheme to the at least one cell: applying a write voltage to the write word line, applying the write voltage to one of the group consisting of the write bit line and the further bit line and applying ground voltage to the other one of said group. The memory controller may additionally or alternatively be adapted to apply the following read scheme to the at least one cell: applying a read voltage to the read word line and the write word line, applying a further voltage ranging from ground voltage to the read voltage to the write bit line and applying ground voltage to the further bit line.

A second aspect of the present disclosure relates to a method of manufacturing an integrated circuit including a three transistor dynamic random access memory (3T RAM) cell. The method includes the steps of: providing a substrate, dividing the substrate in at least three sections, e.g. by shallow trench isolation, forming at least one field effect transistor (FET) in each section, and back end of line (BEOL) processing, comprising the formation of a plurality of metal layers interconnected by conductive via structures and connected to the front end of line (FEOL). The substrate may be a bulk silicon (Si) wafer or a silicon-on-insulator (SOI) wafer, preferably a fully depleted silicon-on-insulator (FD-SOI). The formation of the FET comprising the substeps of: forming a source region and a drain region in the substrate separated by a channel region; and growth of a gate dielectric that is arranged in-between a gate and the channel region, in-between the gate and the source region, and in-between the gate and the drain region. In at least one section a ferroelectric field effect transistor (FeFET) is formed.

In one embodiment, the gate dielectric of the FeFET is a ferroelectric dielectric. In another embodiment, the gate dielectric of the FeFET is conductively connected to a ferroelectric dielectric provided in at least one of the metal layers of the BEOL.

In other embodiments, the at least one field effect transistor is formed as a single-gate planar FET or a multiple-gate FET, such as FinFET or trigate transistor.

A third aspect of the present disclosure relates to a method of operating an integrated circuit including a three transistor dynamic random access memory (3T RAM) cell, the method comprising writing a memory state on a storage node of the 3T RAM cell employing a write bit line and a write word line and/or reading the memory state on the storage node employing a read bit line and a read word line.

BRIEF DESCRIPTION OF THE DRAWINGS

The disclosure will be explained in more detail below with reference to drawings in which illustrative embodiments thereof are shown. They are intended exclusively for illustrative purposes and not to restrict the inventive concept, which is defined by the appended claims.

DETAILED DESCRIPTION OF CERTAIN ILLUSTRATIVE EMBODIMENTS

Figure 1:
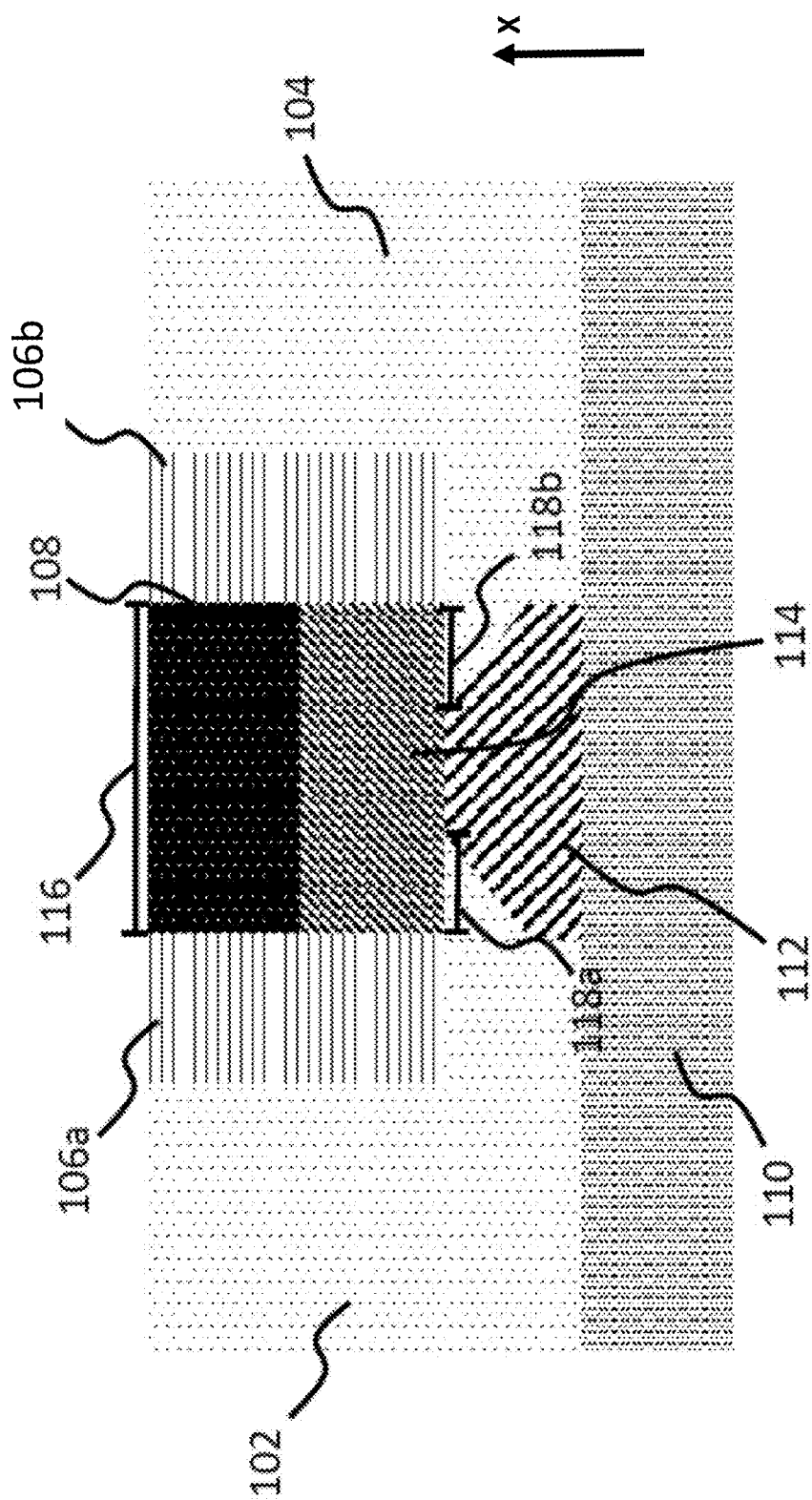
FIG. 1 is a schematic view of a planar single gate ferroelectric-based field effect transistor (FeFET) memory device in cross section according to a first embodiment.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

FIG. 1 illustrates a first embodiment of a planar single gate memory device (such as single gate bulk ferroelectric field effect transistor (FeFET)). The device comprises a substrate 110, which may be a bulk semiconductor substrate, a partially depleted semiconductor-on-insulator (PD-SOI) substrate or a fully depleted semiconductor-on-insulator (FD-SOI) substrate. The substrate 110 may comprise a bulk oxide structure, but the substrate may also be divided into layers, e.g. a lower oxide layer and a partly depleted silicon layer on top of the lower oxide layer. On a surface of the substrate 110, there is provided a source region 102 and a drain region 104. The source 102 and drain 104 are separated by a channel region 112. The material of the channel region may be a crystalline semiconductor material such as, e.g., Si. Above the channel region 112, there is provided a gate structure 108. Moreover, there is provided a dielectric structure 114, 106a, 106b arranged between the gate structure 108 and the channel region 114. The dielectric structure 114, 106a, 106b comprises a ferroelectric memory region 114, e.g., from a hafnium (Hf)-based ferroelectric material.

As can be seen in FIG. 1, an upper part of the channel region 112 may be narrowed towards the ferroelectric memory region 114. This may for example be achieved by means of doping, forming lightly doped drain (LDD)/heavily doped drain (HDD) junctions, such that an effective area of the channel region 112 (e.g., in the embodiment of FIG. 1, the area of an interface between the ferroelectric memory region 114 and the channel region 112), is reduced. In other words, a projection of the gate 108 on the surface portion of the substrate 110 overlaps with the source 102 and drain 104 regions and defines a first overlap region 118a with the source region, and a second overlap region 118b with the drain region. According to some embodiments, the gate structure defines a gate length 116, and wherein a combined length of the first 118a and second 118b overlap regions is at least 5% of the gate length 116. According to some embodiment, the combined area of the first 118a and second 118b overlap regions is larger than the area of an interface between the dielectric structure 114, 106a, 106b and the channel region 112. By the described embodiment, a ratio between a combined area of the first 118a and second 118b overlap regions and an area of an interface between the dielectric structure and the channel region (effective channel area) is adapted such that the ferroelectric memory region is programmable by an electric field applied between the gate structure and source and drain region through the ferroelectric region.

Moreover, in the embodiment of FIG. 1, there is provided two further dielectric structures 106a, 106b laterally positioned to the gate 108 in respect to the first surface (lower surface in FIG. 1) of the gate 108. In other words, the dielectric structures 106a, 106b are provided beside the gate structure 108 in a current flow direction of the channel 112. Such structures may also be called spacers. The dielectric structures 106a, 106b may be formed by a ferroelectric material. Consequently, the read window of the device may be increased.

Figure 2:
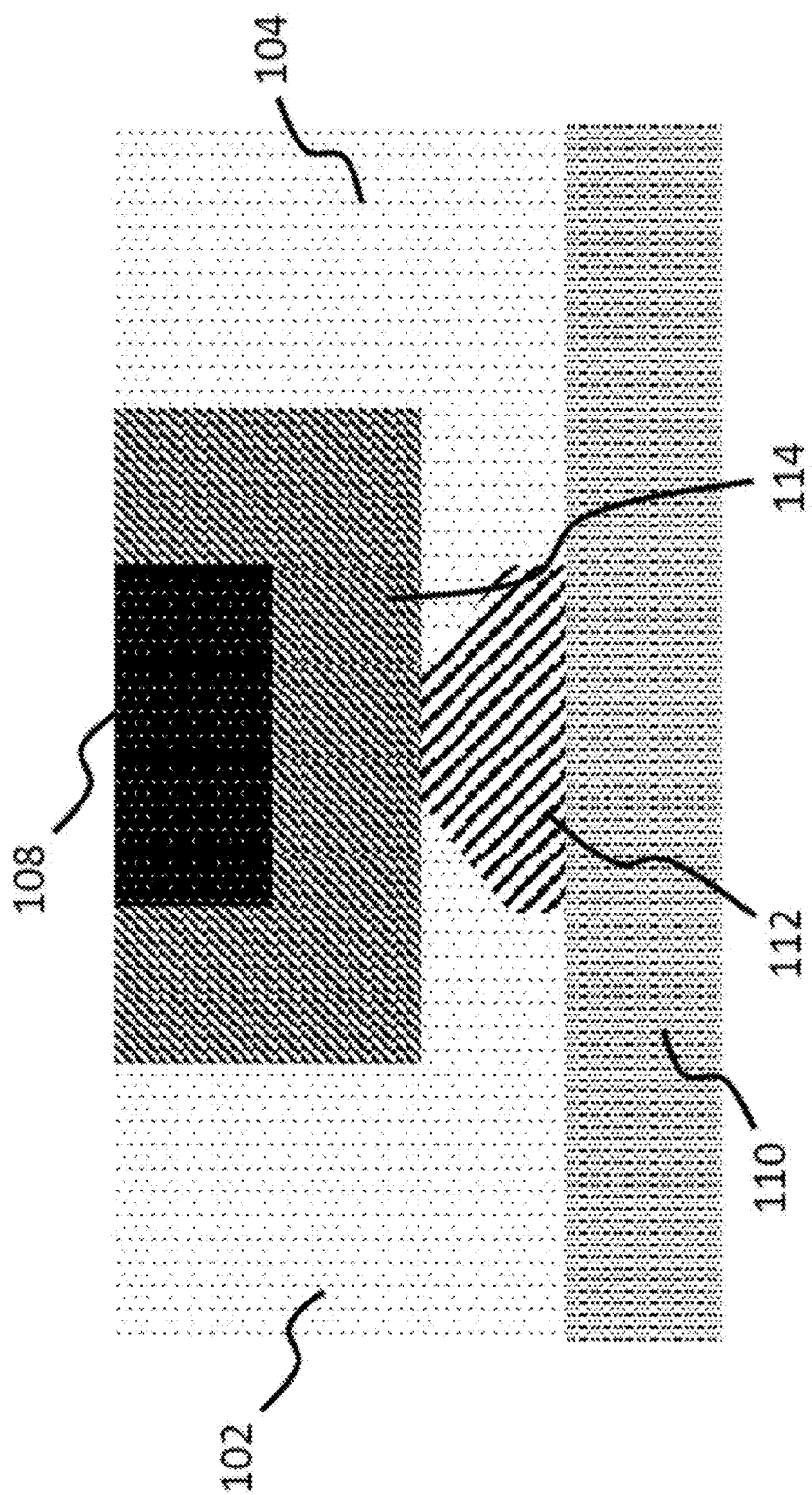
FIG. 2 is a schematic view of a planar single gate FeFET memory device in cross section according to a second embodiment.

FIG. 2 illustrates a second embodiment of a planar single gate memory device (such as single gate bulk FeFET formed on a bulk, PD-SOI, or FD-SOI substrate), similar to the embodiment of FIG. 1 in some aspects. A detailed description of features similar to those in FIG. 1 is omitted for brevity. Distinguishably from the embodiment of FIG. 1, in the illustrated embodiment, the ferro-electric memory region is provided around the gate structure 108. In other words, the gate structure 108 has a second surface not facing the surface portion of the substrate 110, wherein the ferroelectric memory region 114 comprises an interface with said first and second surface. In yet other words, the ferroelectric memory region 114 is provided also laterally positioned to the gate structure 108.

Figure 3:
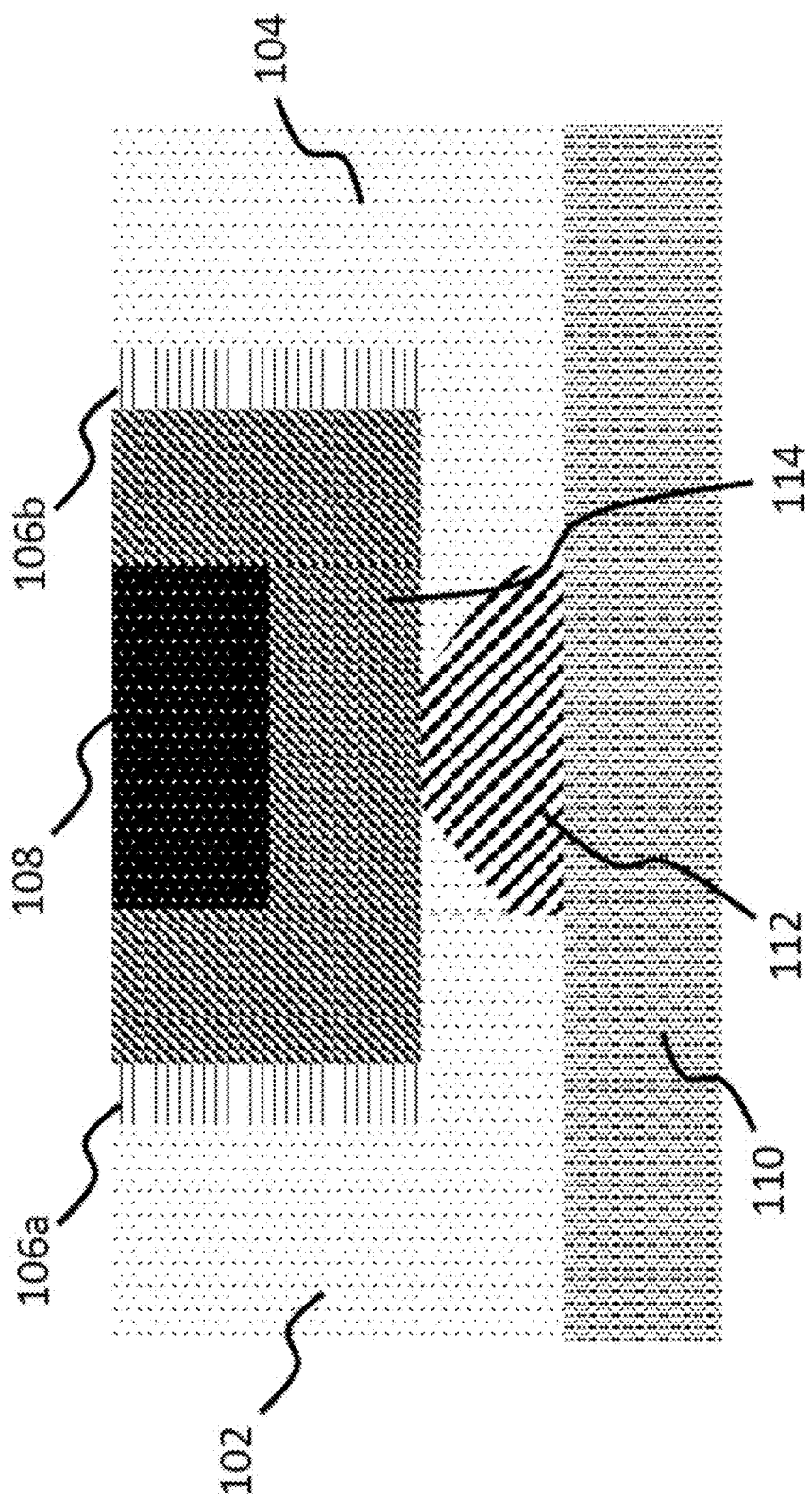
FIG. 3 is a schematic view of a planar single gate FeFET memory device in cross section according to a third embodiment.

FIG. 3 illustrates a third embodiment of a planar single gate memory device (such as single gate bulk FeFET formed on a bulk, PD-SOI, or FD-SOI substrate), similar to the embodiment of FIG. 2 in some aspects. A detailed description of features similar to those described above in FIG. 2 is omitted for brevity. Distinguishably from the embodiment of FIG. 2, in the illustrated embodiment, the ferroelectric memory region 114 is provided also laterally positioned to the gate structure 108, like in FIG. 2. Moreover, the read window of the device is further increased by providing spacers 106a, 106b outside the ferroelectric memory region 114, laterally positioned to the gate structure 108.

Figure 4:
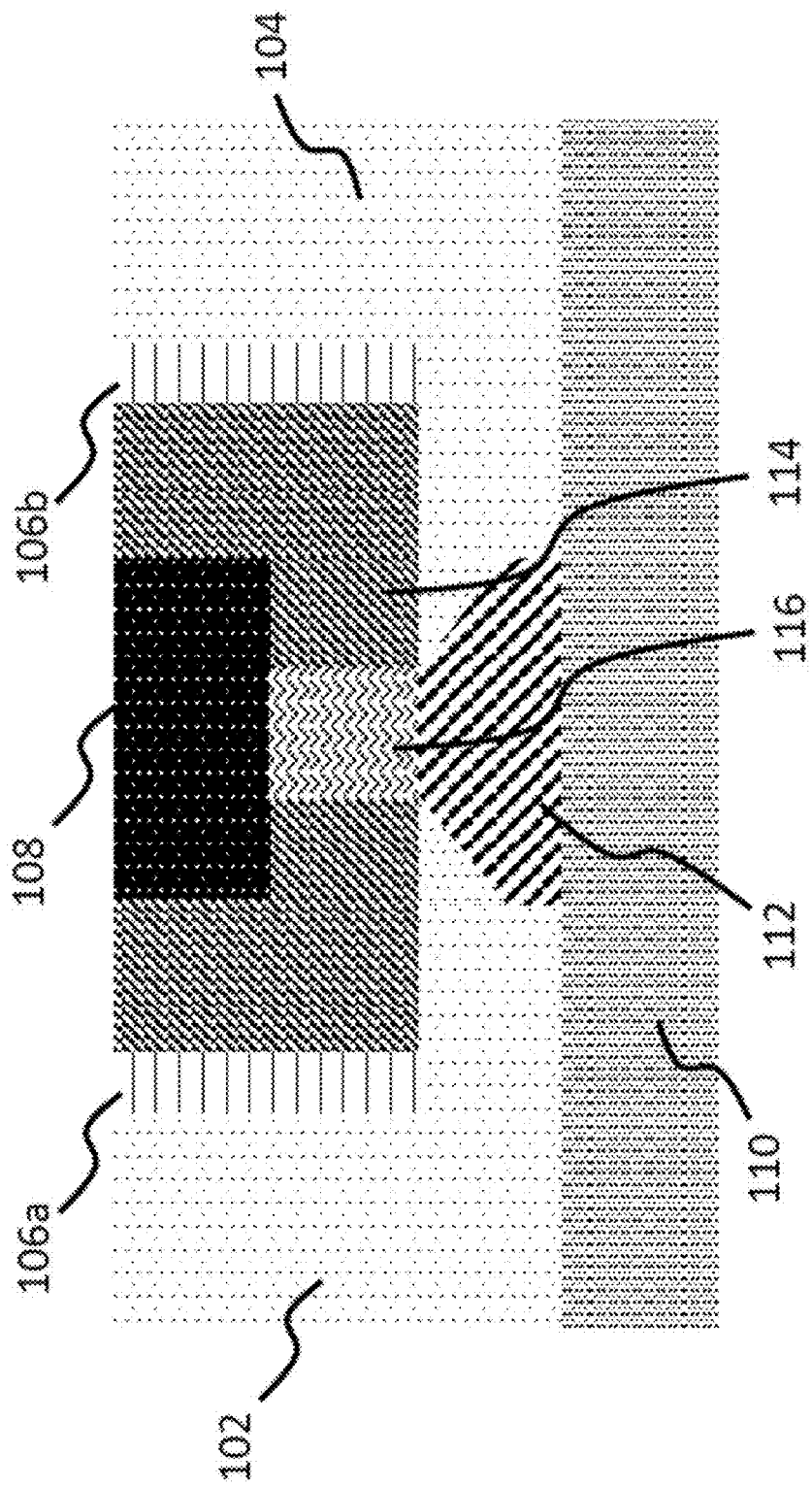
FIG. 4 is a schematic view of a planar single gate FeFET memory device in cross section according to a fourth embodiment.

FIG. 4 illustrates a fourth embodiment of a planar single gate memory device (such as single gate bulk FeFET formed on a bulk, PD-SOI, FD-SOI substrate), which is similar to the embodiment of FIG. 3 in some aspects. A detailed description of features similar to those in FIG. 3 is omitted for brevity. Distinguishably from the embodiment of FIG. 3, however, in FIG. 4, a region between the gate 108 and the effective channel area comprises a non-ferroelectric high-k material 116, to provide a further increased read window for the device.

Figure 5:
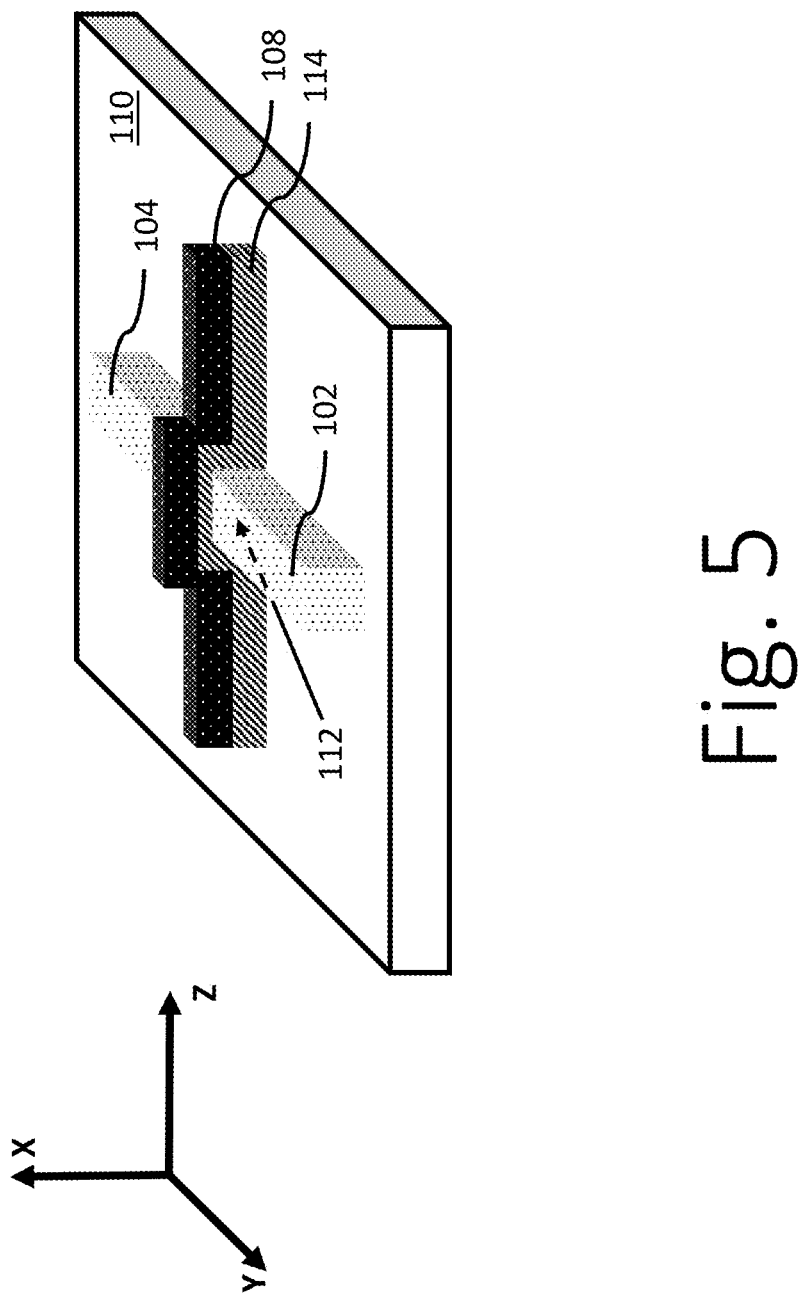
FIG. 5 is a schematic view of a multigate FeFET memory device according to the disclosure.

As described herein, the inventive concept of this disclosure can further be implemented in a FinFET memory device, which can be formed on a bulk, PD-SOI, FD-SOI substrate 110. FIG. 5 shows schematically a FinFET formed on a substrate 110 wherein source 102 and drain 104 regions are formed in a semiconductor fin at opposite sides thereof in lateral direction along the y-axis. A gate structure 108 straddles the fin in a direction perpendicular to its lateral direction thereby separating the source 102 and drain 104 regions by a channel region 112 underneath the gate structure 108. The gate structure 108 and the channel region 112 are separated by a dielectric structure 114, in this case a ferroelectric memory region 114.

The gate structure 108 defines a first overlap region with the source region 102, and a second overlap region with the drain region 104. As described above, the gate structure 108 defines a gate length 116, and a combined length of the first and second overlap regions is at least 5% of the gate length 116. According to some embodiments, the combined area of the first and second overlap regions is larger than the area of an interface between the dielectric structure 114 and the channel region 112 (e.g., the effective channel area).

Figure 6:
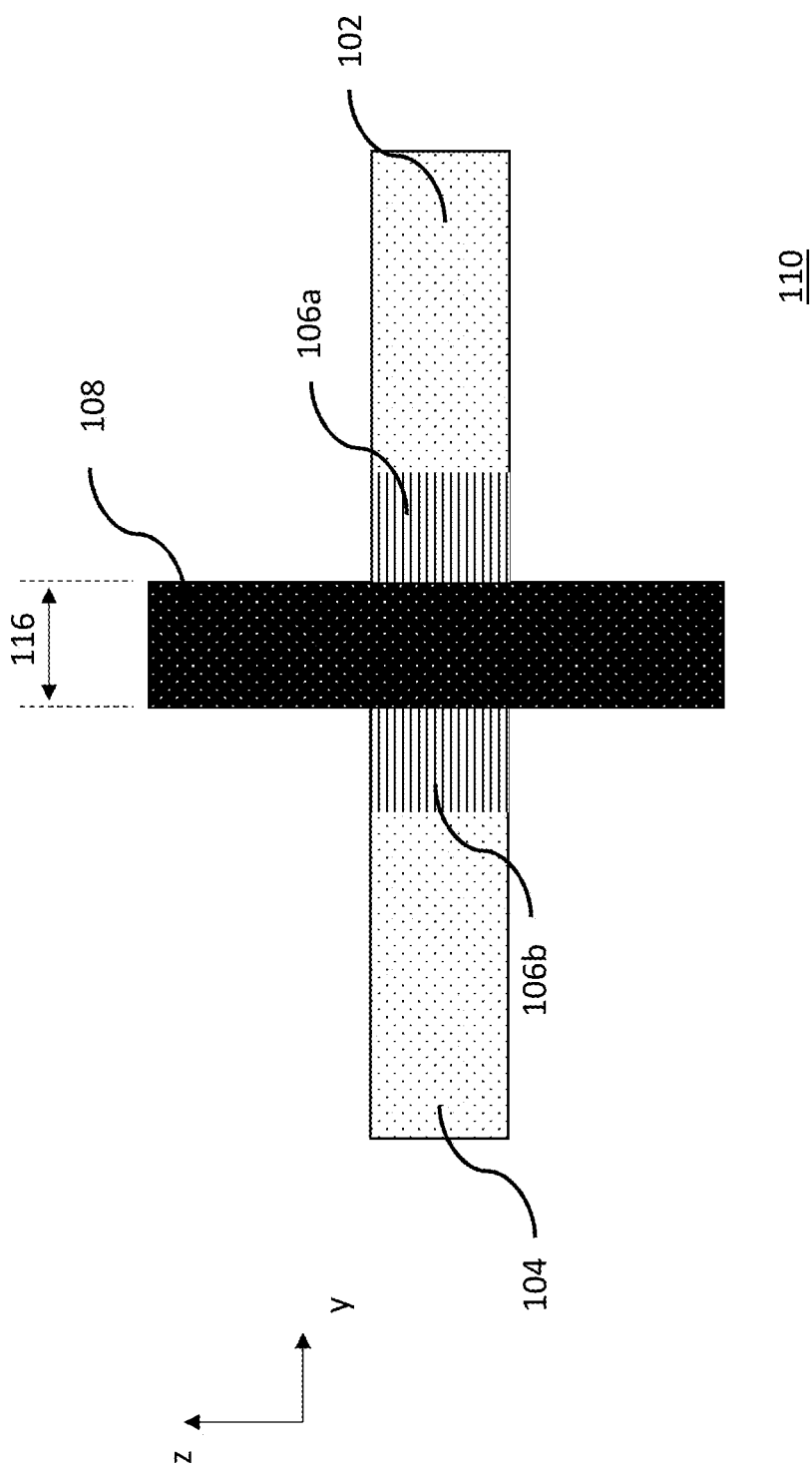
FIG. 6 is a schematic top view of a multigate FeFET memory device in cross section according to a first embodiment.

FIG. 6 illustrates a first embodiment of a multigate device, which is similar to the device of FIG. 5 in some aspects. A detailed description of features similar to those in FIG. 3 is omitted for brevity. In addition, there are two spacers 106a, 106b provided laterally positioned to the gate 108 in a y-direction. In other words, the spacers 106a, 106b are provided beside the gate structure 108 in a current flow direction of the channel 112, like in FIG. 1.

Figure 7:
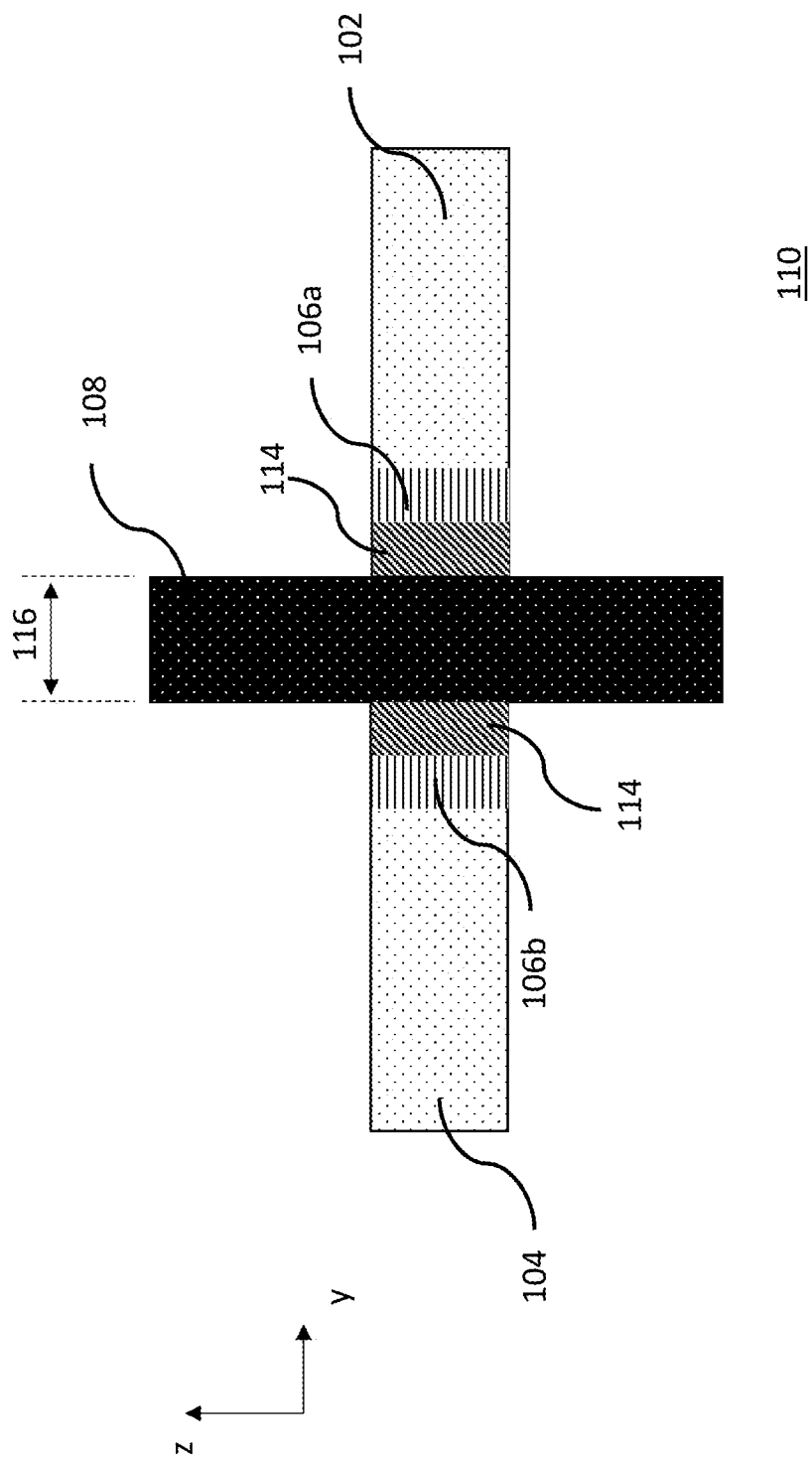
FIG. 7 is a schematic top view of a multigate FeFET memory device in cross section according to a second embodiment.

FIG. 7 illustrates a second embodiment of a multigate device, which is similar to the device of FIG. 6. In this embodiment, the ferroelectric memory region 114 is also provided laterally positioned to the gate structure 108 in a y-direction, in an analogous manner to the planar single gate memory device described above with respect to FIG. 3. Moreover, spacers 106a, 106b are provided outside the ferroelectric memory region 114, and laterally positioned relative to the gate structure 108.

The concept may further be provided for a gate-all-around FeFET memory device. In this embodiment, the gate structure arranged to at least partly enclose the channel region (thus being substantially pipe shaped), wherein the dielectric structure is formed on an inside surface of the gate structure. In this arrangement, the channel is thus extending through the gate structure. To increase the area of an interface between the dielectric structure and the source and drain regions, the gate structure further at least partly enclose at least parts of the source region and the drain region.

By the above disclosed concept, programming of the FeFET memory device can be achieved by a method for programming a FeFET memory device as described herein, the method comprising:
  writing a first logic state (e.g., a logic one) to the ferroelectric memory by providing a first voltage difference between the gate structure and the drain and the source;
  writing a second logic state (e.g., a logic zero) to the ferroelectric memory by providing a second voltage difference between the gate structure and the drain and the source.

An advantage of the device as described herein is that no negative voltage to programming the FeFET may be needed. This may be advantageous in that it reduces the power needed for programming the device, and that the control circuits of the device may be simplified. Consequently, the method of programming the device may comprise the step of achieving the first voltage difference by providing a supply voltage to the gate and a ground to the source and drain. Moreover, the method of programming the device may comprise the step of achieving the second voltage difference by providing a supply voltage to the source and drain and a ground to the gate.

Figure 8:
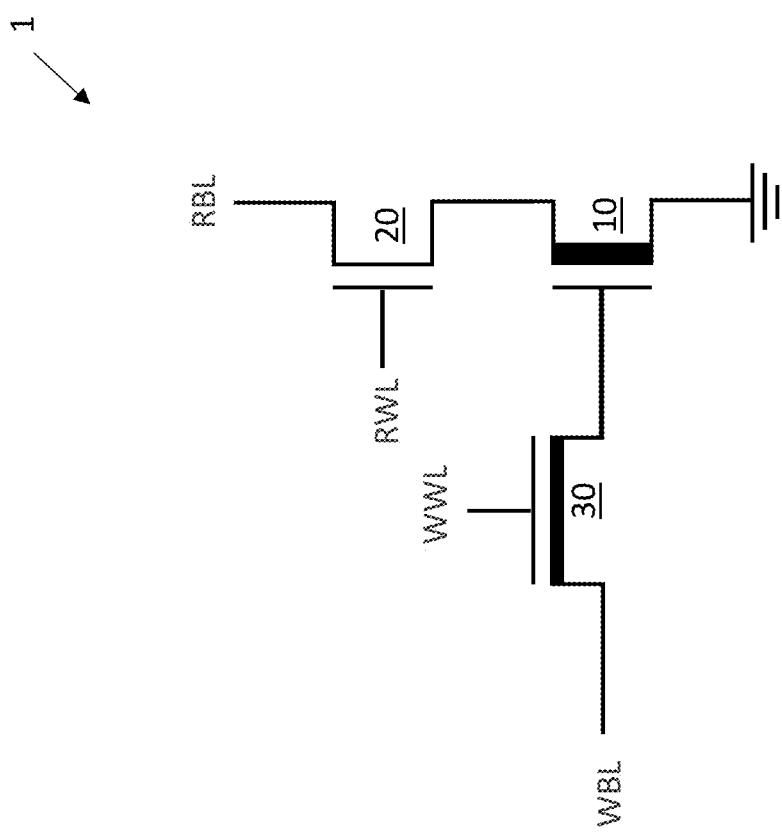
FIG. 8 shows a schematic view of an integrated circuit including at least one three transistor random access memory (3T RAM) cell.
Figure 9:
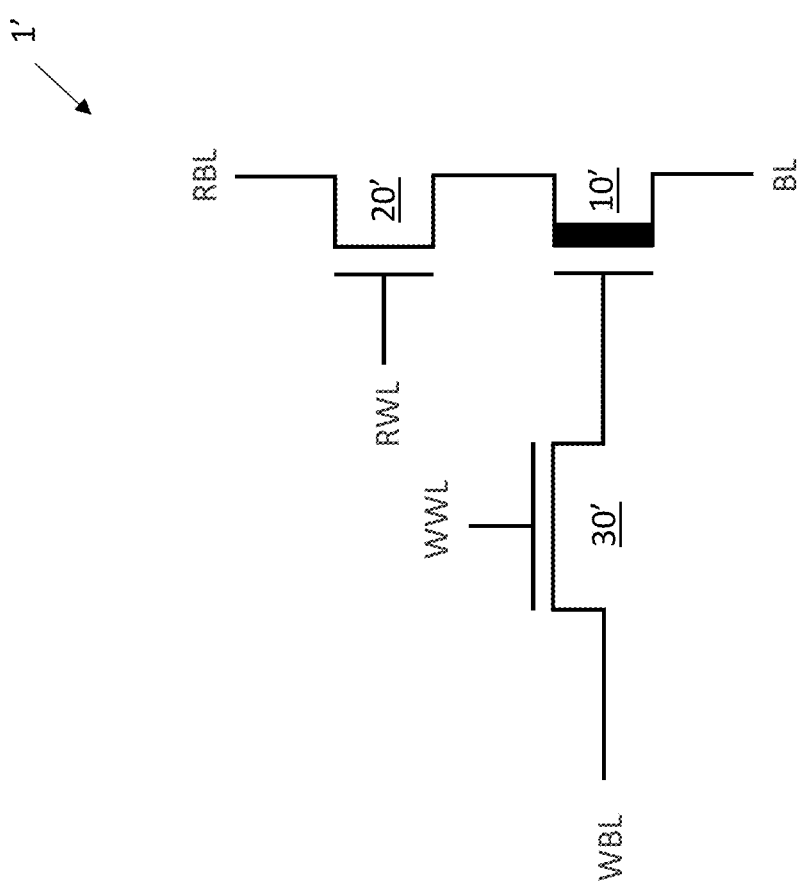
FIG. 9 shows a schematic view of another variation of an integrated circuit including at least one three transistor random access memory (3T RAM) cell.

FIGS. 8 and 9 illustrate embodiments of three transistor random access memory (3T RAM) cells generally designated 1, 1' and constructed according to embodiments of the present disclosure. The 3T RAM cells 1, 1' employ a read word line (RWL) and a write word line (WWL) structure. Generally, the 3T RAM cells 1, 1' may be included in an embedded memory connected to other portions of an integrated circuit. Alternatively, the 3T RAM cells 1, 1' may be included in a discrete memory contained in the integrated circuit.

The 3T RAM cells 1 (FIG. 8), 1' (FIG. 9) include respective first and second transistors 10, 10' and 20, 20' that are series-connected between a ground and a read bit line RBL, as shown. Each of the first transistors 10, 10' is a ferroelectric field effect transistor (FeFET) that employs a gate as a storage node. Each of the first transistors 10, 10' may be a FeFET memory device as disclosed in any one of the FIGS. 1-7. The first transistors 10 and 10' also employ a source, which can be connected to the ground, as shown in FIG. 8, or to a further bit line BL, as shown in FIG. 9, and a drain that is series-connected to a source of the respective one of the second transistors 20, 20'. A drain of the each of the second transistors 20, 20' is connected to the RBL, and a gate is employed as a second control element connected to a RWL.

The 3T RAM cells 1 (FIG. 8), 1' (FIG. 9) include respective third transistors 30 (FIG. 8), 30' (FIG. 9) that are connected between the respective storage nodes and the WBLs employing a drain and provide a respective gate as a second control element connected to a WWL 113. A source of each of the third transistors 30, 30' is employed to connect to the WBL, as shown.

During a read operation, the read word line RWL activates the second transistor 20, 20' for the read operation by applying a read voltage $V_r$, and the write word line WWL activates the third transistor 30, 30' by applying the read voltage $V_r$. During a write operation, a write voltage $V_{dd}$ corresponding to a desired logic state for the 3T RAM cell 1 is placed on the WBL. When the write word line WWL activates the third transistor 30, 30' for the write operation, the write voltage corresponding to the desired logic state on the WBL is transferred to the gate of the first transistor 10, 10' thereby adjusting the storage node 10, 10' to the desired logic state for the 3T RAM cell 1,1'.

In the 3T RAM cell 1' shown in FIG. 9, the read word line RWL is activated by applying a voltage equal to or larger than the voltage applied to the write word line WWL. A complimentary logic of the write bit line WBL may be transferred to the read bit line RBL and the further bit line BL during a write operation.

Figure 10:
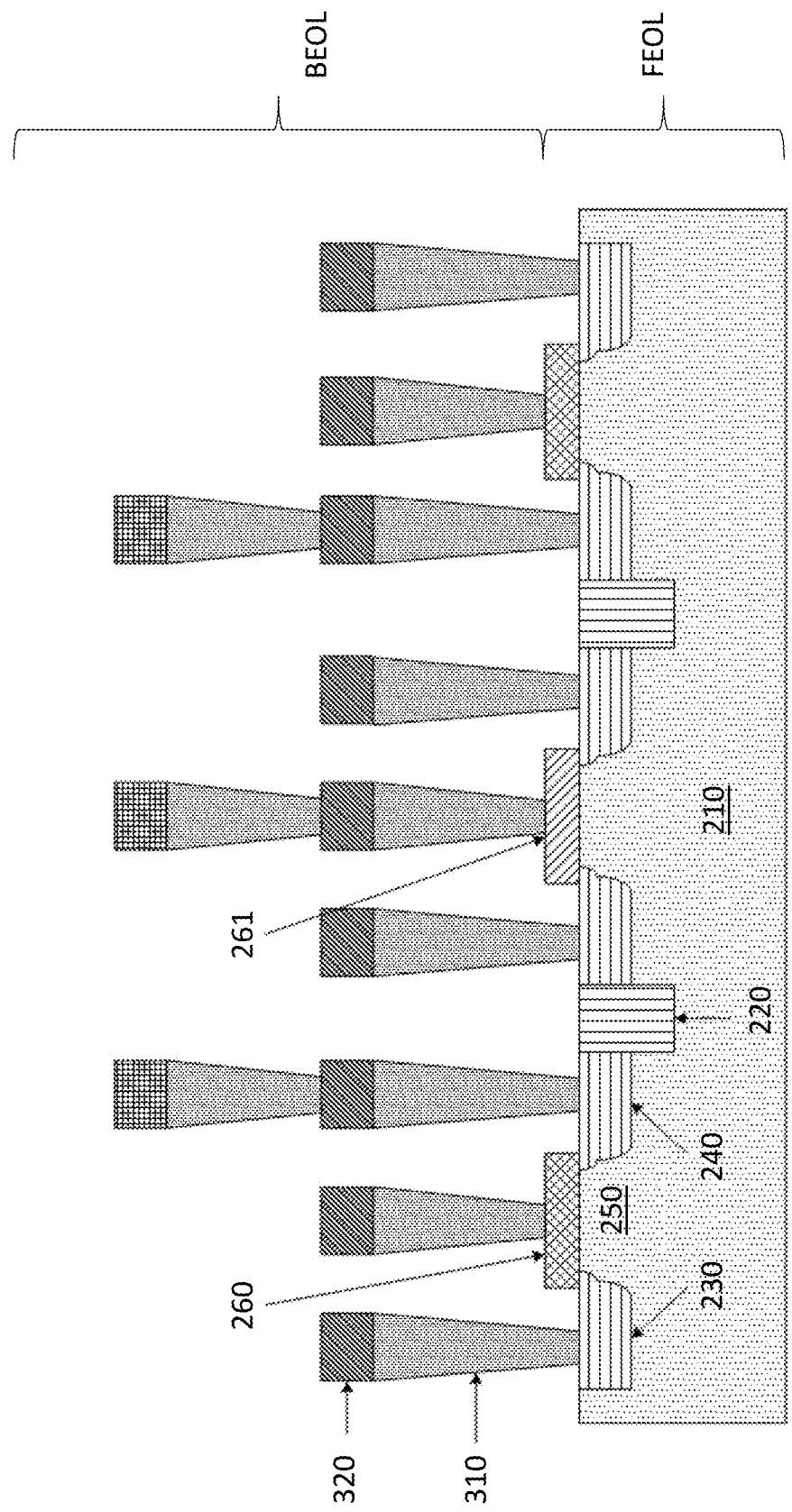
FIG. 10 shows a schematic cross-sectional view of a partially-fabricated integrated circuit device.
Figure 11:
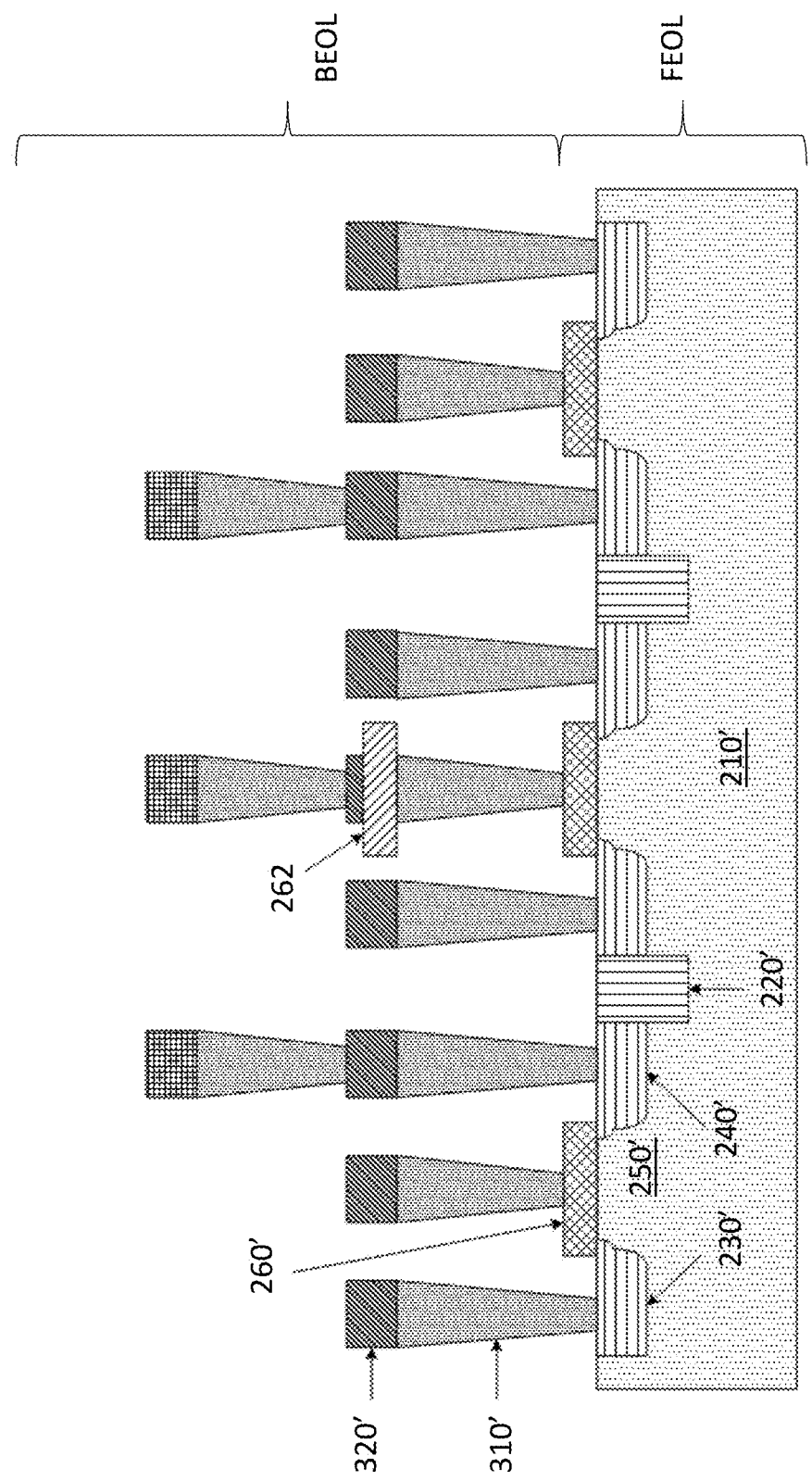
FIG. 11 shows a partial cross-sectional view of another variation of a partially-fabricated integrated circuit device.

FIGS. 10 and 11 illustrate embodiments of a partially-fabricated integrated circuit device constructed according to a method of manufacturing of the present disclosure. The method comprises front end of line (FEOL) processing of the device by providing a substrate 210, 210' which contains transistors divided by isolation 220, 220'. The substrate 210, 210' may be a bulk Si structure, but the substrate may also be divided into layers, e.g. a lower oxide layer and a fully depleted silicon layer on top of the lower oxide layer. The transistors may be a single-gate planar FET, shown in FIGS. 1-4, or a multiple-gate FET, shown in FIGS. 5, 6 and 7, such as a FinFET or a trigate transistor.

In particular, the FEOL processing comprises providing a substrate 210, 210', e.g., a bulk silicon (Si) wafer or a silicon-on-insulator (SOI) wafer, preferably a fully depleted silicon-on-insulator (FD-SOI) and dividing that substrate three sections, for example by shallow trench isolation. The FEOL processing further comprises, in each section, forming a source region 230, 230' and a drain region 240, 240' in the substrate separated by a channel region 250, 250' and growing a gate dielectric 260, 260', 261 that is arranged in-between a gate and the channel region, between the gate and the source region, and between the gate and the drain region. The material of the channel region may be a crystalline semiconductor material such as, e.g., Si.

The method comprises back end of line (BEOL) processing of the device by formation of a plurality of metal layers 320, 320' interconnected by conductive via structures 310, 310' and connected to the front end of line.

In the method, a ferroelectric dielectric is provided, either as the gate dielectric 261, shown in FIG. 10, or provided in at least one of the metal layers 320, 320' of the BEOL, shown in FIG. 11.

Figure 12:
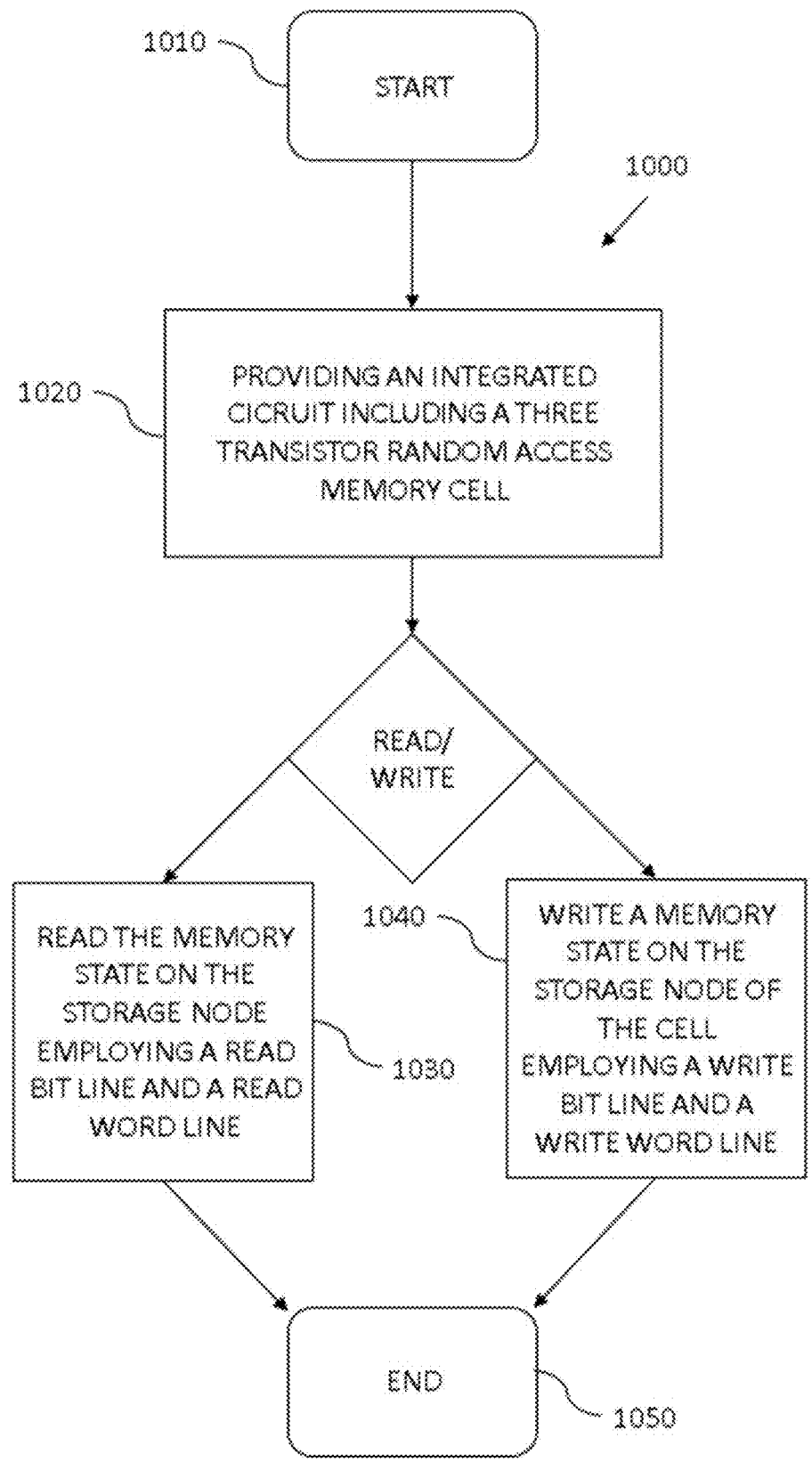
FIG. 12 shows a flow diagram of a method of operating an integrated circuit including at least one three transistor random access memory (3T RAM) cell.

FIG. 12 illustrates a flow diagram of an embodiment of a method 1000 of operating an integrated circuit including a three transistor random access memory (3T RAM) cell constructed according to the principles of the present disclosure. The method 1200 starts in a step 1210, and the integrated circuit with the 3T RAM cell is provided in a step 1220. Then, in a step 1240, a memory state is written on a storage node of the 3T DRAM cell employing a write bit line and a write word line controlling a transistor connected to the write bit line. Alternatively, a memory state on the storage node is read employing a read bit line and a read word line controlling a transistor connected to the write bit line, in a step 1230. The method 1200 ends in a step 1250.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure. In addition, while various methods disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

What is claimed is:

1. An integrated circuit including at least one three-transistor random access memory (3T RAM) cell, the integrated circuit comprising:
   a first transistor having a first gate connected as a storage node;

a second transistor connected between the first transistor and a read bit line having a second gate connected to a read word line; and a third transistor connected between the storage node and a write bit line having a third gate connected to a write word line, wherein the first transistor is a ferroelectric-based field effect transistor (FeFET), the first transistor comprising a horizontally extending ferroelectric memory region disposed vertically between the first gate and a channel, the first transistor further comprising vertically extending ferroelectric layers disposed laterally between the first gate and each of a source and a drain.

2. The integrated circuit according to claim 1, further comprising a memory controller adapted to:
apply a write scheme to the at least one 3T RAM cell, the write scheme comprising:
applying a write voltage to the write word line, and
applying the write voltage or ground voltage to the write bit line; and/or
apply a read scheme to the at least one 3T RAM cell, the read scheme comprising:
applying a read voltage to the read word line, and
applying ground voltage to the write word line.

3. The integrated circuit according to claim 1, wherein a gate dielectric of the second transistor and a gate dielectric of the third transistor comprise gate oxides, wherein a gate oxide thickness of the third transistor is greater than a gate oxide thickness of the second transistor, such that the third transistor is adapted to sustain a double gate electrical field relative to the second transistor.

4. The integrated circuit according to claim 3, further comprising a memory controller adapted to:
apply a write scheme to the at least one 3T RAM cell, the write scheme comprising:
applying a write voltage to the write word line, and
applying the write voltage or the negative write voltage to the write bit line; and/or
apply a read scheme to the at least one 3T RAM cell, the read scheme comprising:
applying a read voltage to the read word line and the write word line, and
applying a further voltage ranging from ground voltage to the read voltage to the write bit line.

5. The integrated circuit according to claim 1, further comprising a further bit line connected to the source of the first transistor.

6. The integrated circuit according to claim 5, further comprising a memory controller adapted to:
apply a write scheme to the at least one 3T RAM cell, the write scheme comprising:
applying a write voltage to the write word line,
applying the write voltage to one of the write bit line and the further bit line, and
applying ground voltage to the other of the write bit line and the further bit line; and/or
apply a read scheme to the at least one 3T RAM cell, the read scheme comprising:
applying a read voltage to the read word line and the write word line,
applying a further voltage ranging from ground voltage to the read voltage to the write bit line, and
applying ground voltage to the further bit line.

7. The integrated circuit of claim 1, wherein the horizontally extending ferroelectric memory region and the vertically extending ferroelectric layers are formed of the same ferroelectric material.

8. The integrated circuit of claim 1, wherein the vertically extending ferroelectric layers laterally overlap the first gate and each of the source and the drain.

9. A method of operating an integrated circuit, the method comprising:
providing the integrated circuit comprising a three transistor random access memory (3T RAM) cell, the 3T RAM cell comprising:
a first transistor configured as a ferroelectric-based field effect transistor (FeFET) having a first gate connected as a storage node, the first transistor comprising a horizontally extending ferroelectric memory region disposed vertically between the first gate and a channel, the first transistor further comprising vertically extending ferroelectric layers disposed laterally between the first gate and each of a source and a drain,
a second transistor connected between the first transistor and a read bit line having a second gate connected to a read word line, and
a third transistor connected between the storage node and a write bit line having a third gate connected to a write word line; and
writing a memory state on the storage node by employing the write bit line and the write word line or reading the memory state on the storage node by employing the read bit line and the read word line.

10. The method according to claim 9, wherein the method comprises writing the memory state by applying one of the following write schemes to the 3T RAM cell:
a first write scheme comprising:
applying a write voltage to the write word line, and
applying the write voltage or ground voltage to the write bit line;
a second write scheme comprising:
applying a write voltage to the write word line, and
applying the write voltage or the negative write voltage to the write bit line; or
a third write scheme comprising:
applying a write voltage to the write word line,
applying the write voltage to one of the write bit line and the further bit line, and
applying ground voltage to the other of the write bit line and the further bit line.

11. The method according to claim 9, wherein the method comprises reading the memory state by applying one of the following read schemes to the 3T RAM cell:
a first read scheme comprising:
applying a read voltage to the read word line, and
applying ground voltage to the write word line; or
a second read scheme comprising:
applying a read voltage to the read word line and the write word line, and
applying a further voltage ranging from ground voltage to the read voltage to the write bit line.

12. The method according to claim 9,
wherein providing the integrated circuit comprise providing the 3T RAM cell in a crossbar memory architecture, and
wherein the method comprises writing the memory state, comprising:
applying a write voltage to a selected write word line,
applying a negative write voltage to non-selected write word lines, and
applying a second write voltage having the same magnitude as the write voltage or the negative write voltage to the write bit line.

13. The method according to claim 9, wherein the method comprises reading the memory state, comprising:
   applying a read voltage to a selected read word line and a selected write word line;
   applying ground voltage to non-selected word lines; and
   applying a write voltage ranging from ground voltage to the read voltage to the write bit line.

* * * * *